United States Patent
Haralson et al.

(10) Patent No.: US 12,068,516 B2
(45) Date of Patent: Aug. 20, 2024

(54) MICROSCALE PLASMA LIMITER INTEGRATED INTO THICK FILM INTERCONNECT

(71) Applicant: Rockwell Collins, Inc., Cedar Rapids, IA (US)

(72) Inventors: Zachary Haralson, Iowa City, IN (US); Jonathan A. Lovseth, Marion, IA (US); Michael C. Meholensky, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 252 days.

(21) Appl. No.: 17/704,173

(22) Filed: Mar. 25, 2022

(65) Prior Publication Data

US 2023/0307808 A1  Sep. 28, 2023

(51) Int. Cl.
*H01P 1/14* (2006.01)
*H03G 11/00* (2006.01)

(52) U.S. Cl.
CPC ............ *H01P 1/14* (2013.01); *H03G 11/004* (2013.01)

(58) Field of Classification Search
CPC ..... H01P 1/00; H01P 1/14; H01P 3/00; H03G 11/00; H03G 11/04; H03G 11/004
USPC ...................................... 333/13, 12
See application file for complete search history.

(56) References Cited

U.S. PATENT DOCUMENTS

| | | | |
|---|---|---|---|
| 4,586,105 A | 4/1986 | Lippmann et al. | |
| 4,891,730 A | 1/1990 | Saddow et al. | |
| 6,353,290 B1 | 3/2002 | Glenn et al. | |
| 8,199,457 B1 | 6/2012 | Palandech et al. | |
| 8,493,160 B2 | 7/2013 | Nicole et al. | |
| 9,177,907 B1 | 11/2015 | Lower et al. | |
| 9,728,835 B2 | 8/2017 | Lam et al. | |
| 9,774,067 B2 * | 9/2017 | Poust ................... | H03G 11/002 |
| 2011/0057740 A1 | 3/2011 | Nicole et al. | |
| 2015/0244048 A1 | 8/2015 | Poust et al. | |
| 2019/0305548 A1 | 10/2019 | Lam | |

OTHER PUBLICATIONS

Extended European Search Report dated Aug. 3, 2023; European Application No. 23162263.0.
Missen Zach Vander et al. "Toward a High-Power High-Isolation Wideband Plasma Limiter", 2019 IEEE 20th Wireless and Microwave Technology Conference (WAMICON), IEEE, Apr. 8, 2019, pp. 1-4.

* cited by examiner

*Primary Examiner* — Hai L Nguyen (74) *Attorney, Agent, or Firm* — Suiter Swantz IP (57) ABSTRACT

A radio frequency (RF) transmission line is described. The RF transmission line includes a first ground line, a second ground line, and a signal line disposed on a substrate and forming a coplanar waveguide. A plasma limiter feature is integrated into an internal surface of one or more of the first ground line, the second ground line, and the signal line. The plasma limiter decreases a gap distance between the signal line and the associated ground line. The gap distance is selected, together with a gas pressure, to control a voltage at which the gas within the gap breaks down, targeted at a breakdown power of 1 W across a wide bandwidth. The plasma limiter thus limits a power transmitted by way of the RF transmission line for protecting a sensitive integrated circuit.

19 Claims, 7 Drawing Sheets

MICROSCALE PLASMA LIMITER INTEGRATED INTO THICK FILM INTERCONNECT

GOVERNMENT LICENSE RIGHTS

This invention was made with government support under Contract #FA8650-21-C-7005 awarded by the Defense Advanced Projects Agency (DARPA). The government has certain rights in the invention.

TECHNICAL FIELD

The present invention generally relates to radio frequency (RF) transmission lines, and more specifically to power limiters for RF transmission lines.

BACKGROUND

Sensitive radio frequency (RF) circuits may be designed to receive signals with power levels in the microwatt or nanowatts range. However, the RF circuits may be subject to high levels of power, such as during adversary jamming, electronic attack, or ally co-site transmission. Diode limiters provide one method of limiting the power received by the RF circuits. However, the diode limiters are unable to handle very high levels of power. Therefore, it would be advantageous to provide a device, system, and method that cures the shortcomings described above.

SUMMARY

A radio frequency (RF) transmission line is disclosed, in accordance with one or more embodiments of the present disclosure. In one illustrative embodiment, the RF transmission line includes a substrate with a surface. In another illustrative embodiment, the RF transmission line includes a first ground line disposed on the surface. In another illustrative embodiment, the RF transmission line includes a second ground line disposed on the surface. In another illustrative embodiment, the RF transmission line includes a signal line disposed on the surface between the first ground line and the second ground line forming a coplanar waveguide with the first ground line and the second ground line. In another illustrative embodiment, the signal line, the first ground line, and the second ground line are substantially parallel in a first section of the radio frequency transmission line. In another illustrative embodiment, the signal line and the first ground line define a first gap. In another illustrative embodiment, the signal line and the second ground line define a second gap. In another illustrative embodiment, the first gap and the second gap are hermetically sealed and include a gas maintained at a pressure. In another illustrative embodiment, the RF transmission line includes a plasma limiter disposed between the signal line and the first ground line in the first gap. In another illustrative embodiment, the plasma limiter is integrated into one or more of the signal line or the first ground line. In another illustrative embodiment, the plasma limiter defines a spark-gap between the signal line and the first ground line. In another illustrative embodiment, the RF transmission line includes a breakdown power threshold at which the gas disposed in the spark-gap forms a plasma.

A microscale package is disclosed, in accordance with one or more embodiments of the present disclosure. In one illustrative embodiment, the microscale package includes an integrated circuit chip. In another illustrative embodiment, the microscale package includes a radio frequency (RF) transmission line. In another illustrative embodiment, the RF transmission line includes a substrate including a surface. In another illustrative embodiment, the system includes a first ground line disposed on the surface. In another illustrative embodiment, the system includes a second ground line disposed on the surface. In another illustrative embodiment, the system includes a signal line disposed on the surface between the first ground line and the second ground line and forming a coplanar waveguide with the first ground line and the second ground line. In another illustrative embodiment, the signal line, the first ground line, and the second ground line are substantially parallel in a first section of the radio frequency transmission line. In another illustrative embodiment, the signal line and the first ground line define a first gap in the first section. In another illustrative embodiment, the signal line and the second ground line define a second gap in the first section. In another illustrative embodiment, the first gap and the second gap are hermetically sealed and include a gas maintained at a pressure. In another illustrative embodiment, the system includes a plasma limiter disposed between the signal line and the first ground line in the first gap. In another illustrative embodiment, the plasma limiter is integrated into one or more of the signal line or the first ground line. In another illustrative embodiment, the plasma limiter defines a spark-gap between the signal line and the first ground line. In another illustrative embodiment, the radio frequency transmission line includes a breakdown power threshold at which the gas disposed in the spark-gap forms a plasma. In another illustrative embodiment, the plasma changes a characteristic impedance of the radio frequency transmission line. In another illustrative embodiment, each of the signal line, the first ground line, and the second ground line is coupled to the integrated circuit chip. In another illustrative embodiment, the change in the characteristic impedance of the radio frequency transmission line limits a power to the integrated circuit chip. In another illustrative embodiment, each of the signal line, the first ground line, and the second ground line is further configured to couple to a carrier substrate.

BRIEF DESCRIPTION OF THE DRAWINGS

Implementations of the concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION OF THE INVENTION

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Reference will now be made in detail to the subject matter disclosed, which is illustrated in the accompanying drawings. Broadly, embodiments of the disclosure are directed to a RF transmission line formed as a coplanar waveguide (CPW). During operation, electrical current runs down a signal line over to a circuit coupled to the RF transmission line and the current returns from the circuit by way of ground lines. Electromagnetic fields are formed in between the signal line and the ground lines. If the layers of metal composing the transmission line are sufficiently thick, the vertical surfaces of the coplanar waveguide (CPW) and the gap between them may develop fields as in a parallel plate configuration. If the field strength between the signal and the ground is strong enough, the gas will break down into a plasma, altering the behavior of the gas dielectric. By setting the geometry and controlling the pressure and gas fill to force a particular field when a power threshold is met, a circuit is created that behaves differently before and after the power threshold is reached. Before the threshold, the circuit is a passive, linear structure. Beyond the threshold, the circuit is designed to be reflective, acting as a limiter for circuits connected to the RF transmission line. However, voltages of the CPW with fifty-ohm impedance may be insufficient for plasma breakdown prior to reaching a critical power level of ten to one-hundred watts, which may be higher than desired for a given application. To achieve plasma breakdown at a lower power threshold, the RF transmission line includes a feature to control the plasma breakdown voltage at which the plasma is formed. The feature is a power limiter provided to limit power transmission within the RF transmission line. By maintaining a fifty-ohm characteristic impedance between the signal and the ground, the RF transmission line may achieve sufficiently low insertion loss prior to plasma breakdown. Low insertion loss is generally desirable in transmitting power from the input to the output. High return loss is generally desirable in preventing power to bounce back to the input. On the other hand, the plasma breakdown may be advantageous for controlling the characteristic impedance to prevent excessive power transmission. The amount of energy from input to output may thus be maximized below the plasma breakdown threshold, and once the plasma breakdown threshold is reached, the output energy may be limited to protect a circuit coupled to the output, thereby protecting sensitive RF equipment (e.g., receivers or software defined radio (SDR)) from damage.

Figure 1A:
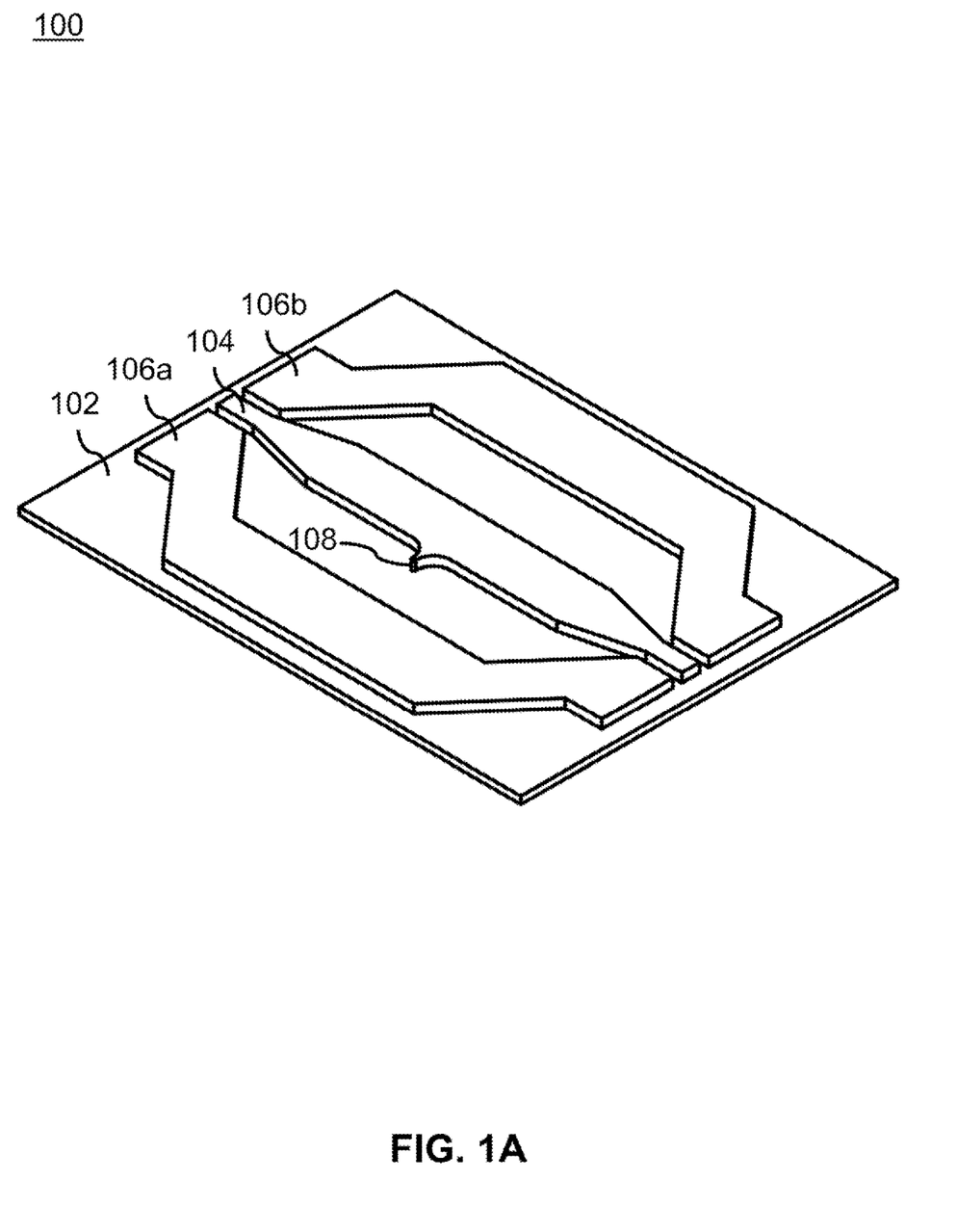
FIG. 1A depicts a perspective view of a radio frequency (RF) transmission line, in accordance with one or more embodiments of the present disclosure.
Figure 1B:
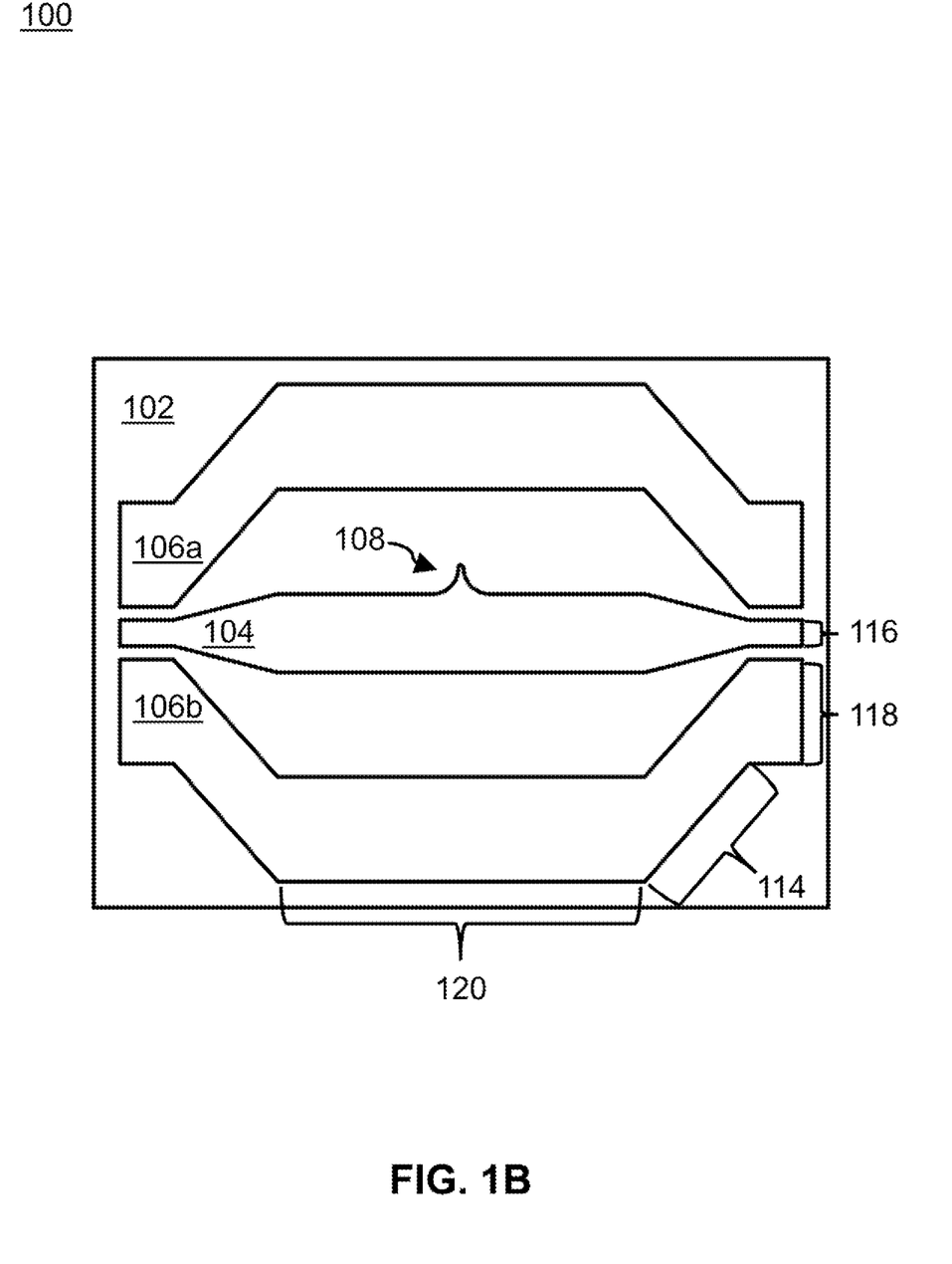
FIG. 1B depicts a top view of a radio frequency (RF) transmission line, in accordance with one or more embodiments of the present disclosure.
Figure 1C:
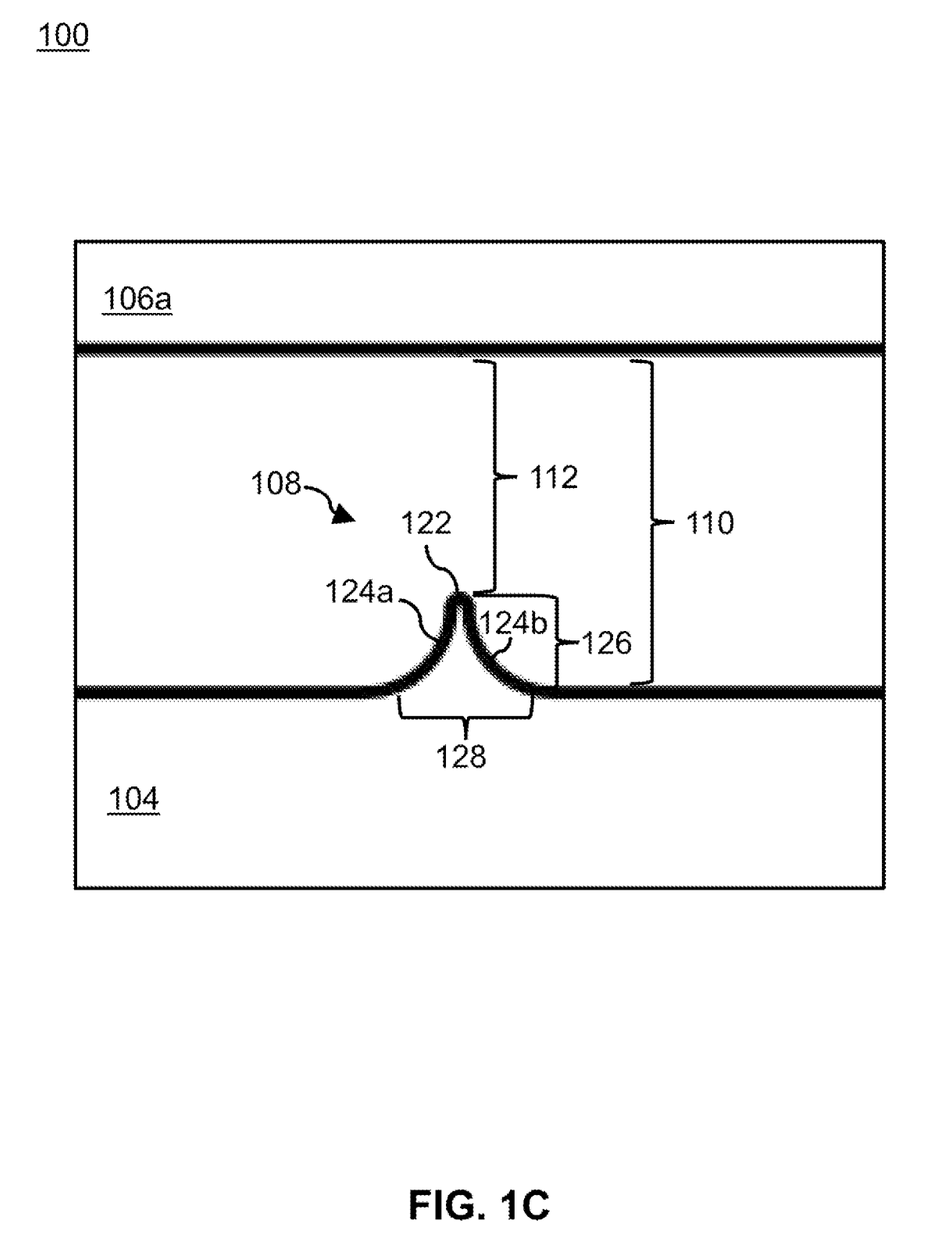
FIG. 1C depicts a partial top view of a plasma limiter, in accordance with one or more embodiments of the present disclosure.

Referring now to FIGS. 1A-1C, a RF transmission line 100 is described, in accordance with one or more embodiments of the present disclosure. The RF transmission line 100 may include a substrate 102 and one or more passive RF components, such as, but not limited to, a signal line 104, ground lines 106, and one or more plasma limiters 108. One or more of the signal line 104 and the ground lines 106 may be disposed on the substrate 102. The substrate 102 may generally include any substrate material, such as a ceramic material. The ceramic material may include, but is not limited to, alumina, beryllium oxide, aluminum nitride, and the like. In embodiments, the signal line 104, the ground line 106a, and the ground line 106b may be arranged to form a coplanar waveguide (CPW). For example, the signal line 104 may be disposed between the ground line 106a and the ground line 106b on the substrate 102. A gap 110 (also referred to as a signal-to-ground gap) may be defined between the signal line 104 and the ground line 106.

In embodiments, one or more of the signal line 104 and the ground line 106 may include engineered features to engage plasma at specific power levels, such as, but not limited to, the plasma limiter 108. The plasma limiter 108 may be designed to create plasma at a microscale level, which may also be referred to as RF micro-plasma. The plasma may be generated when the input RF power on the signal line 104 exceeds a chosen voltage or power threshold. The generated plasma changes the characteristic impedance of the RF line 100, causing a mismatch with the source and reflecting power away from sensitive electronics downstream. For example, the plasma limiter 108 may be designed such that the RF transmission line 100 includes a breakdown power of between 1 and 10 watts.

The plasma limiter 108 may define a spark-gap 112 between the signal line 104 and the ground line 106. A width of the spark-gap 112 may be less than a width of the signal-to-ground gap 110 (also referred to herein as a gap). In this regard, the spark-gap 112 may define a minimum gap distance (Gmin) for the gap 110. The plasma limiter 108 may be configured to start a plasma discharge (e.g., an RF glow discharge) upon reaching a specific power or voltage threshold, which may also be referred as a breakdown voltage. For example, the RF transmission line 100 may be designed such that the spark gap and the gas pressure generate plasma at the given breakdown voltage in accordance with the theories of RF plasma physics. Once the plasma discharge is formed, a portion of the RF current will flow from the signal line 104 to the ground line 106. The remainder of the RF current will then flow through the signal line 104 to a downstream component. Integrating the plasma limiter 108 into the RF transmission line 100 may be advantageous, since the RF transmission line 100 may be useable as an interconnect and packaging, with negligible size, weight, and cost increases. Likewise, no added power consumption is necessary, since the plasma is generated from the unwanted incoming RF power. Additionally, the use of thick-film plasma limiter structures allows for higher power handling and lower insertion loss than other options. As may be understood, the plasma limiter 108 may be integrated into the signal line 104 or the ground line 106 by fabricating the plasma limiter 108 together with the associated line during an additive thick film metal process. Once the RF power is high enough, gas breakdown causes plasma to form, thereby changing the characteristic impedance of the RF transmission line 100 and forming a mismatch loss to limit power delivered to sensitive electronics downstream. The plasma then detunes the plasma limiter 108, causing power reflection and limiting power transmission. The plasma limiter 108 thus produces electric-field strengths high enough to produce plasma, so that the RF transmission line no longer includes a characteristic impedance which is matched to a source, and power is reflected to the source. Furthermore, the plasma limiter 108 may be formed on the substrate 102 together with the signal line 104 and the ground lines 106. When RF power drops below a threshold voltage or power, the plasma ceases and the structure returns to a fifty-ohm transmission line, again delivering power to the output with low insertion loss.

In embodiments, one or more components of the RF transmission line 100, such as the signal line 104, the ground lines 106, and the plasma limiter 108 may be constructed via a fabrication process. Such fabrication process may include a microfabrication process such as, but not limited to, an electroplating fabrication process, a sequential patterning deposition fabrication process, an additive thick-film metallization fabrication process, or the like. The use of an additive thick-film metallization fabrication process may be advantageous in providing fine points or other engineered features. The use of the thick film metals may prevent plasma from etching too much material and destroying the associated film. For example, one or more of the signal line 104, the ground lines 106, and the plasma limiter 108 may be fabricated from a gold metal, or other like material which is suitable for microfabrication within the RF transmission line 100.

In embodiments, the plasma limiter 108 may be provided with a point 122 to raise the electric field strength at the point 122, thereby starting the plasma, while also minimizing RF mismatch loss. For example, the plasma limiter may include the point 122 with a diameter between 4 micrometers and 14 micrometers, such as an 11-micrometer diameter. Due to the plasma limiter 108, the RF transmission line 100 may generate a plasma at low insertion power. In this regard, the RF transmission line 100 may be advantageous for RF applications which are sensitive to RF signals at a high-power level. The RF transmission line 100 may also be used for other applications requiring low-power plasma generation. In some instances, the plasma limiter 108 may include a first concave surface 124a and a second concave surface 124b extending from the signal line 104 and meeting at the point 122. The concave surfaces 124 may provide for reducing a stress concentration on the plasma limiter 108 while also minimally impacting the characteristic impedance of the signal line 104 prior to plasma breakdown. The concave surfaces may be provided with a radius of curvature and an aspect ratio. It is further contemplated that the plasma limiter 108 may include alternative structures.

In embodiments, the RF transmission line 100 include a parallel section 120. The parallel section 120 may define a portion in which the signal line 104 and the ground lines are substantially parallel. As depicted, the plasma limiter 108 may be integrated into one or more of the signal line 104 or the ground lines 106 at a portion within the parallel section 120. The parallel section 120 may include the gap 110 defined between the signal line 104 and the ground line 106. The parallel section 120 may be advantageous for achieving a desired characteristic impedance prior to plasma breakdown. The characteristic impedance may be controlled for both return loss and insertion loss. For example, the gap 110 may include a distance of between 50 micrometers and 500 micrometers. In embodiments, the parallel section 120 may extend for a length. For example, the length may be between 100 micrometers and 10 millimeters, or more. The signal line 104 may also include a width 116. For example, the width 116 may be between 50 micrometers and 500 micrometers in the parallel section 120. The ground line 106 may also include a width 118. The width 118 may be less than infinity in the parallel section 120, such that the RF transmission line 100 may be considered a finite ground coplanar waveguide (FGCPW). In embodiments, the signal line 104 may include a thickness and the ground line 106 may include a thickness. As used herein, the term thickness may correspond to an amount by which the associated line extends from a surface of the substrate 102. The thickness of the signal line 104 and the thickness of the ground line 106 may be selected to force the electric fields in between the signal line 104 and the ground line 106, thereby preventing damage to electronic components near the RF transmission line 100. The thicknesses may be substantially equal, such that the signal line 104 and the ground line 106 extend from the substrate 102 for a similar distance. For example, the thicknesses may be between 22.5 micrometers and 300 micrometers from the surface of the substrate. One or more of the dimensions may be selected to achieve a desired characteristic impedance prior to plasma breakdown, such as, but not limited to, a characteristic impedance of 50 ohms. In this regard, the characteristic impedance of the RF transmission line 100 may be based on the signal-to-ground gap distance and the width of the signal line 104. Furthermore, the plasma limiter 108 may include a similar thickness to the line in which the plasma limiter 108 is integrated (e.g., the signal line 104 and/or the ground line 106).

In embodiments, the RF transmission line 100 includes one or more tapered sections 114. For example, the parallel section 120 may be disposed between the tapered sections 114. The tapered sections 114 may define a portion in which the ground lines 106 converge inwards towards the tapered section 114. The tapered section 114 may also define a portion in which the width 116 of the signal line 104 decreases. In some instances, the gap 110 distance decreases because the ground lines 106 converge at a rate which is greater than a rate at which the width 116 of the signal line 104 decreases. As depicted, the ground lines 106 may converge inwards at a linear rate and the width 116 of the signal line 104 may decrease at a linear rate, although this is not intended to be limiting. Furthermore, the width 118 of the ground lines 106 may be maintained or decrease along the tapered section 114.

In embodiments, the gap 110 is hermetically sealed and includes gas maintained at a pressure. The gas is configured to function as a dielectric when the power carried by the signal line is below the breakdown power. In this regard, the gas may include a low conductivity prior to a breakdown voltage, thereby preventing power from leaking from the signal line to the ground lines. By selecting the pressure and the type of gas, the breakdown power may be selectively controlled. The gas pressure in combination with the spark-gap distance between the signal line 104 and the ground line 106 may thus provide for the formation of plasma at a desired power. The RF transmission line 100 may include a breakdown power of between 1 watt and 10 watts over an operational frequency range of 2 to 18 gigahertz (i.e., across the entire frequency range). The breakdown power across the operational frequency range may be advantageous where the RF transmission line 100 is coupled to a software defined radio which operates across the frequency range. In some instances, the gas is a noble gas, such as, but not limited to, argon. The argon may be maintained at a pressure between 1 Torr and 500 Torr.

In embodiments, the plasma limiter 108 includes an aspect ratio. The aspect ratio of the plasma limiter 108 is based on a width 126 of the plasma limiter relative to a length 128 of the plasma limiter 108. For example, the aspect ratio of the plasma limiter 108 may be proximal to 1, although this is not intended to be limiting. By way of another example, the aspect ratio of the plasma limiter 108 may be greater than 1, such that the width 126 of the plasma limiter 108 is greater than the length 128. The length 128 may be selected to achieve the desired electric field in the spark-gap thereby setting the breakdown power. In some instances, the width 126 may provide minimal impact on the breakdown power. However, the width 126 may be controlled to reduce an impact of the plasma limiter 108 on the characteristic impedance of the RF transmission line 100 prior to plasma breakdown. In this regard, increasing the width 126 may increase the characteristic impedance of the RF transmission line 100 prior to plasma breakdown. Thus the width may be controlled to achieve the desired characteristic impedance.

Figure 2A:
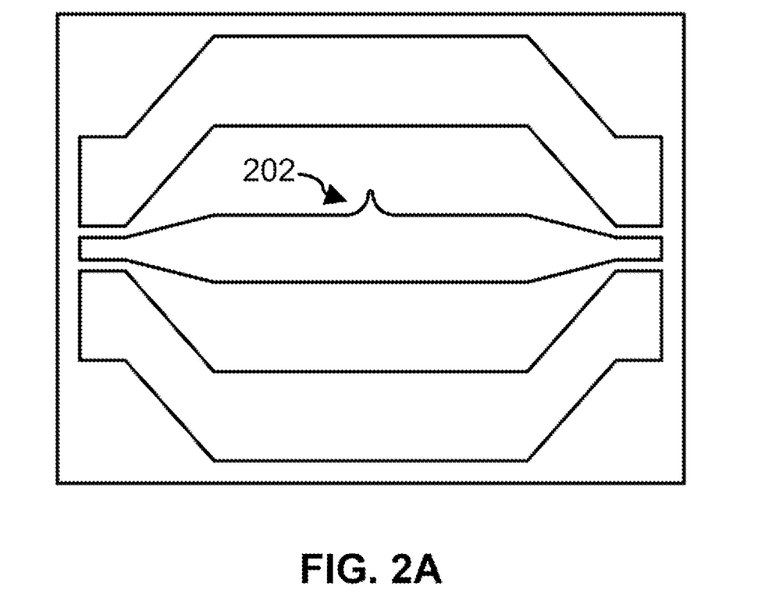
FIGS. 2A-2D depicts a top view of a radio frequency (RF) transmission line including one or more types of plasma limiters, in accordance with one or more embodiments of the present disclosure.
Figure 2B:
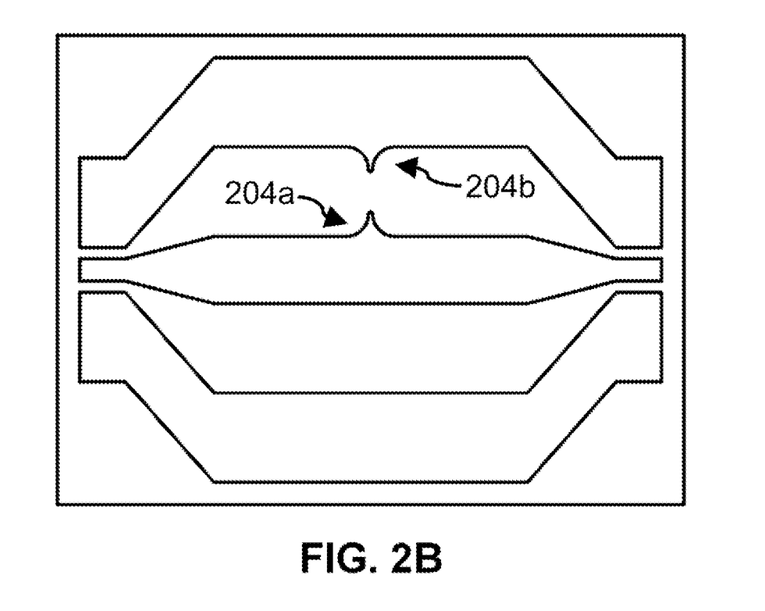

Referring now to FIGS. 2A-2D, a top view of a number of exemplary plasma limiters for the RF transmission line 100 are described, in accordance with one or more embodiments of the present disclosure. As depicted in FIG. 2A, a plasma limiter 202 is disposed on the signal line 104 and includes an aspect ratio proximal to one. As depicted in FIG. 2B, a first plasma limiter 204a is disposed on the signal line 104 and a second plasma limiter 204b is disposed on the ground line 106. The plasma limiters 204 are aligned such that the point 122 of the first plasma limiter 208a and the point 122 of the second plasma limiter 208b are aligned. By aligning the plasma limiters 208, the spark-gap between the signal line 104 and the ground line 106 may be controlled while minimizing a width of the plasma limiters 208. The plasma limiter 202 and the plasma limiters 204a, 204b may be similar to the plasma limiter 108. In this regard, the plasma limiters 108, 202, 208 may include the first concave surface 124a and the second concave surface 124b extending from the signal line 104 and meeting at the point 122.

Figure 2C:
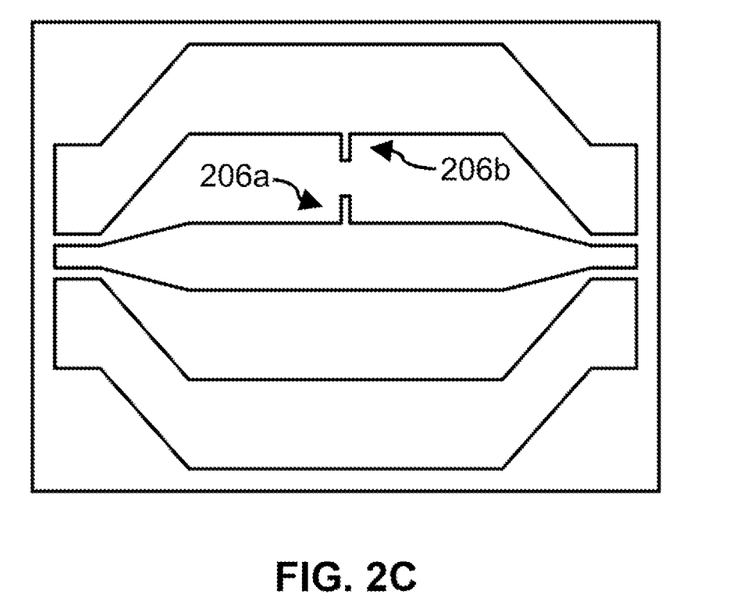

As depicted in FIG. 2C, a first plasma limiter 206a may be disposed on the signal line 104 and a second plasma limiter 206b may be disposed on the ground line 106. The plasma limiters 206 may include an aspect ratio much greater than one. In some instances, the plasma limiters 206 may be formed by electroplating a needle bridge in which the first plasma limiter 206a and the second plasma limiter 206b are physically coupled by an intervening bridge (e.g., formed of similar material as the plasma limiters 206, the signal line 104, and the ground lines 106). The plasma limiters 206 may then be decoupled subsequent to fabrication by removal of the bridge.

Figure 2D:
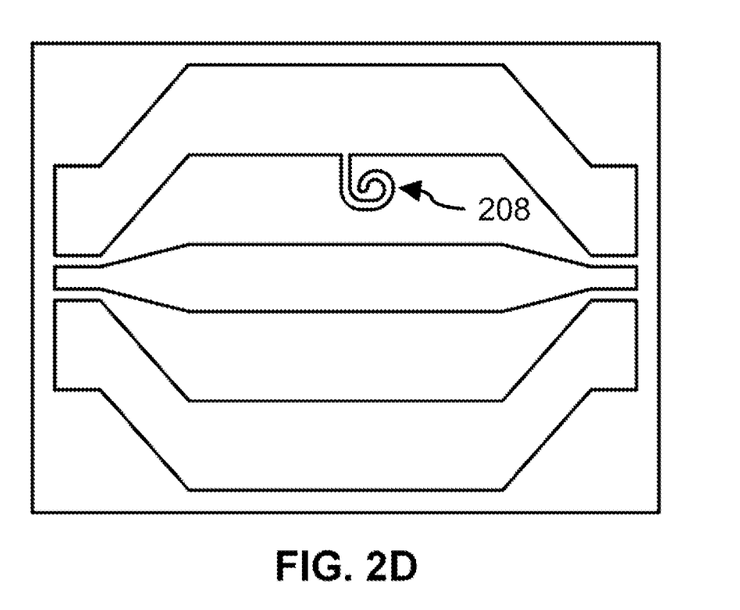

As depicted in FIG. 2D, a plasma limiter 208 may include a resonator. The resonator may be printed on the substrate 102. The resonator may include one or more coil windings. In this regard, the plasma limiter 208 may be considered a spiral-shaped resonator. The shape of the spiral-shaped resonator may be selected to generate an electromagnetic field at a specific frequency range, thereby causing plasma breakdown. For example, the resonator may be designed for causing plasma breakdown at a narrowband frequency. The select frequency may correspond to an operable frequency range of a radar adjacent to the RF transmission line 100 and the radio equipment where the plasma limiter is to be used. In some instances, the breakdown voltage outside of the select frequency range may be higher than the breakdown voltage within the frequency range. The spiral-shaped resonator may generally include any number of turns.

Figure 3A:
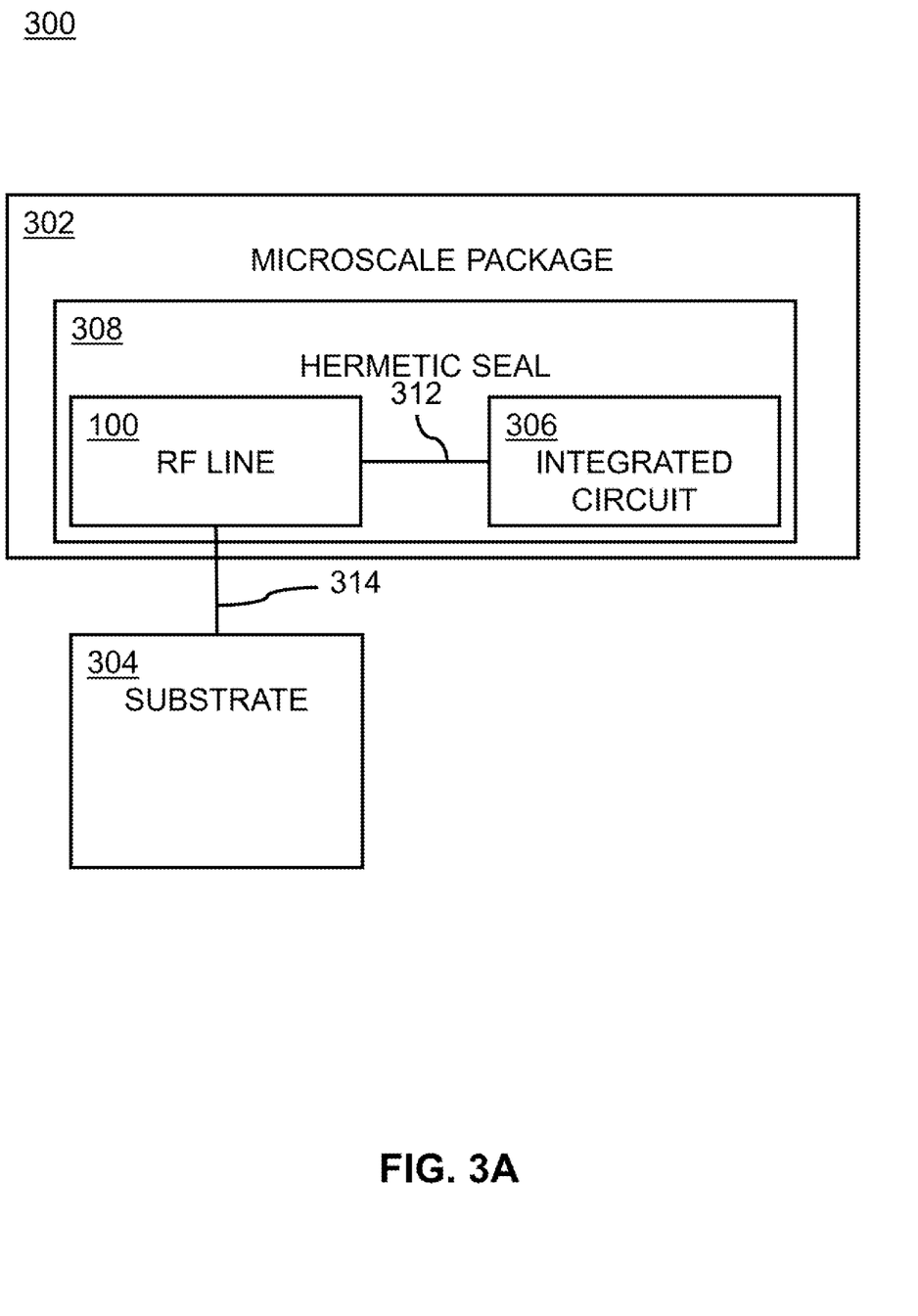
FIGS. 3A-3B depicts a top view of a microscale package coupled to a carrier substrate, in accordance with one or more embodiments of the present disclosure.
Figure 3B:
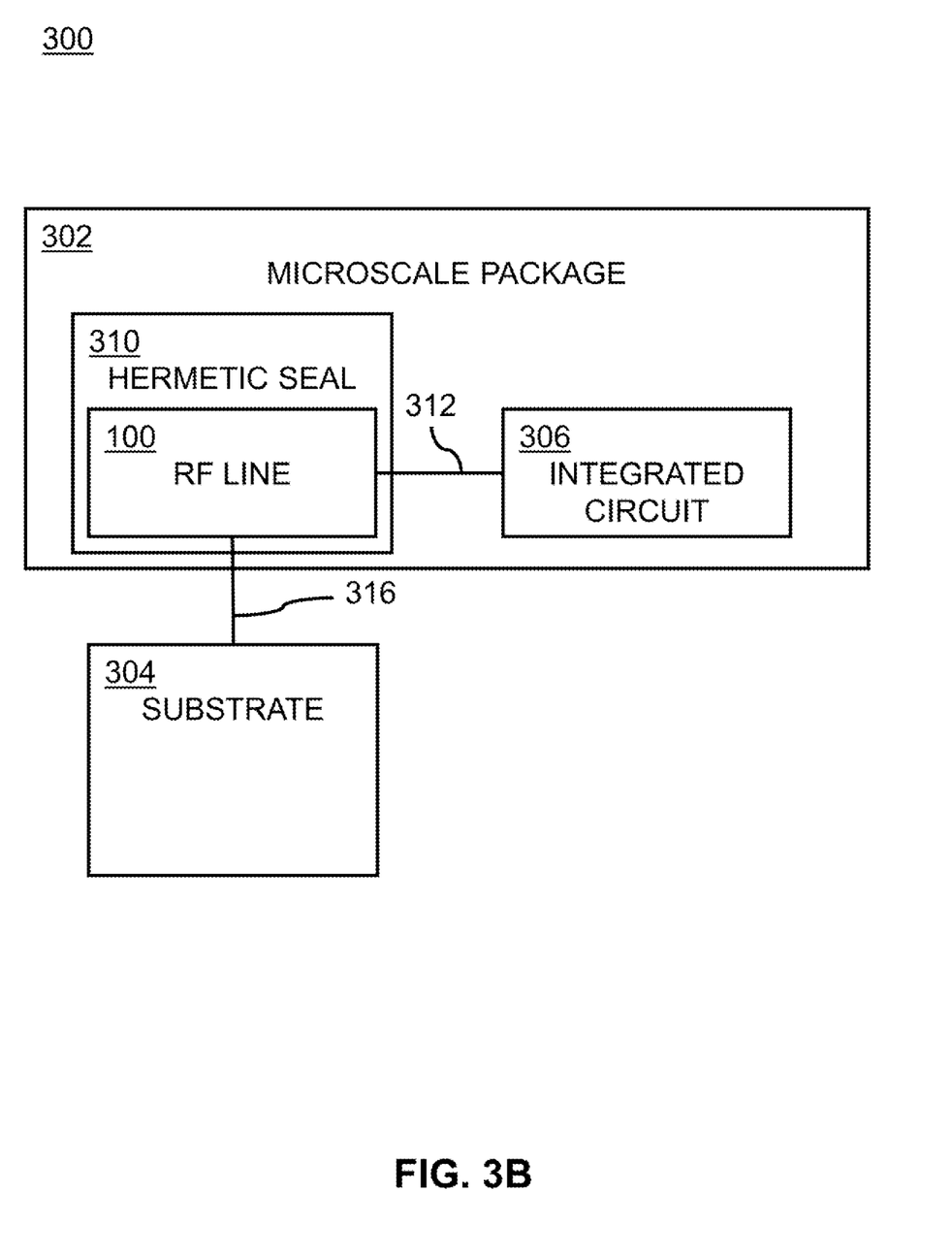

Referring now to FIGS. 3A-3B, a top view of a system 300 including a microscale package 302 coupled to a carrier substrate 304 is described, in accordance with one or more embodiments of the present disclosure. The microscale package 302 may include the RF transmission line 100 and an integrated circuit 306, which are disposed on a substrate of the microscale package 302. The integrated circuit 306 may generally include one or more of a radio-frequency integrated circuit (RFIC), an application-specific integrated circuit (ASIC), or the like. Each of the signal line 104 and the ground lines 106 of the RF transmission line 100 may be coupled to the integrated circuit 306 by a coupling 312, such as, but not limited to, a flip-chip coupling in which the integrated circuit 306 is directly coupled by one or more solder balls, a wire-bond, or any other suitable coupling. The microscale package 302 may be advantageous for integrating the RF transmission line 100 and the integrated circuit 306. In some instances, each of the signal line 104 and the ground lines 106 are coupled to the carrier substrate 304 by a coupling 314, such as, but not limited to, a hermetic via, or another suitable coupling. As previously described herein, the RF transmission line 100 may include the tapered section 114. By the tapered section 114, the RF transmission line 100 narrows to connect from the carrier substrate 304 to the integrated circuit 306.

In embodiments, the RF transmission line 100 is hermetically sealed. As depicted in FIG. 3A, RF transmission line 100 and the integrated circuit 306 is inside of a hermetic seal 308. As depicted in FIG. 3B, RF transmission line 100 is inside of the hermetic seal 310 and the integrated circuit 306 is disposed on a substrate of a microscale package 302, with the integrated circuit 306 being disposed adjacent to a hermetic seal 310. In this example, the hermetic seal 310 may include a dielectric material to prevent conductivity between one or more of the signal line 104, the ground lines 106, or the coupling 312. The hermetic seal 308 and the hermetic seal 310 may utilize a specific pressure or gas in the hermetic microcircuit package to control the power at which plasma will form. For example, the hermetic seal 308 and the hermetic seal 310 may be formed by a hermetic 3D microscale fabrication technique in which the gas backfilled at a specific pressure to control dielectric breakdown voltage. The hermetic seal 308, 310 may generally include any hermetic seal ring for maintaining a gas within the gap 110 between the signal line 104 and the ground lines 106.

In embodiments, the RF transmission line 100 is an additional component placed in front of filtering hardware that limits power across the entire spectrum once an incoming RF signal exceeds a very high-power level, to protect the rest of the circuit. For example, the RF transmission line 100 may provide wideband adaptive RF protection (WARP) for the integrated circuit 306. The plasma limiter feature of the RF transmission line 100 may thus make plasma form when at a given power level to protect circuit on output side. The plasma forms causing energy to be reflected back to the ground line thereby protecting the integrated circuit 306. In this regard, the carrier substrate 304 may include any suitable antenna receiver for receiving the RF signals across the frequency band.

Referring generally again to 1A-3B, the RF transmission line 100 may include a ground plane conductor (not shown). The ground plane conductor may be a conducting surface that serves as a return path for current from electrical components. The ground plane conductor also may act as a heat sink. In this regard, the coplanar waveguide may be considered a conductor-backed coplanar waveguide.

Although the RF transmission line 100 has been described as including a tapered section, this is not intended as a limitation of the present disclosure. In embodiments, the RF transmission line 100 includes one or more of an impedance step out or an impedance step in. However, the use of the tapered section may be advantageous reducing discontinuity effects while also providing a flip-chip mounting location for an integrated circuit on the RF transmission line 100.

One exemplary configuration of the RF transmission line 100 includes a length proximal to 200 micrometers; each of the signal line 104, the first ground line 106a, and the second ground line 106b include a thickness from the surface of the substrate 102 proximal to 22.5 micrometers; the gap 110 distance is proximal to 171 micrometers; the gas is Argon at a pressure proximal to 100 Torr; the spark gap 112 is proximal to 60 micrometers (e.g., 61.1 micrometers); and the point of the plasma limiter 108 includes a diameter of 11.3 micrometers.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed:

1. A radio frequency transmission line comprising:
a substrate including a surface;
a first ground line disposed on the surface;
a second ground line disposed on the surface;
a signal line disposed on the surface between the first ground line and the second ground line and forming a coplanar waveguide with the first ground line and the second ground line; wherein the signal line, the first ground line, and the second ground line are substantially parallel in a first section of the radio frequency transmission line; the signal line and the first ground line defining a first gap in the first section; the signal line and the second ground line defining a second gap in the first section; wherein the first gap and the second gap are hermetically sealed and include a gas; and
a plasma limiter disposed between the signal line and the first ground line in the first gap, the plasma limiter integrated into one or more of the signal line or the first ground line, the plasma limiter defining a spark-gap between the signal line and the first ground line; the radio frequency transmission line including a breakdown power threshold at which the gas disposed in the spark-gap is configured to form a plasma; wherein the plasma changes a characteristic impedance of the radio frequency transmission line;
wherein the plasma limiter comprises a spiral-shaped resonator.

2. The radio frequency transmission line of claim 1, wherein the plasma limiter includes a point with a diameter between 4 micrometers and 14 micrometers.

3. The radio frequency transmission line of claim 2, wherein the radio frequency transmission line is configured to form the plasma across a frequency range between 2 and 18 gigahertz; wherein the breakdown power is between 1 watt and 10 watts across the frequency range.

4. The radio frequency transmission line of claim 3, wherein the transmission line includes a width of between 50 micrometers and 500 micrometers.

5. The radio frequency transmission line of claim 4, wherein each of the signal line, the first ground line, and the second ground line comprise a gold metal including a thickness of between 22.5 micrometers and 300 micrometers from the surface of the substrate.

6. The radio frequency transmission line of claim 5, wherein a distance of the first gap and a distance of the second gap is between 50 micrometers and 500 micrometers.

7. The radio frequency transmission line of claim 6, wherein the gas is a noble gas; wherein the noble gas is Argon; wherein the Argon is at a pressure between 1 Torr and 500 Torr.

8. The radio frequency transmission line of claim 1, wherein the plasma limiter is a first plasma limiter integrated into the signal line, further comprising a second plasma limiter integrated into the first ground line; wherein the first plasma limiter and the second plasma limiter are aligned.

9. The radio frequency transmission line of claim 8, wherein each of the first plasma limiter and the second plasma limiter comprise a first concave surface and a second concave surface.

10. The radio frequency transmission line of claim 8, wherein each of the first plasma limiter and the second plasma limiter comprise an aspect ratio greater than one.

11. The radio frequency transmission line of claim 1, wherein the resonator is configured to generate plasma at a select frequency range at the breakdown power.

12. The radio frequency transmission line of claim 1, wherein a thickness of the plasma limiter is substantially equal to one or more of a thickness of the signal line or a thickness of the first ground line.

13. The radio frequency transmission line of claim 1, wherein the radio frequency transmission line includes a second section; wherein the first ground line and the second ground line converge towards the signal line along the second section; wherein a width of the signal line decreases as the first ground line and the second ground line converge towards the signal line along the second section; wherein a distance of the first gap and a distance of the second gap each decrease along the second section.

14. A microscale package comprising:
an integrated circuit; and
a radio frequency transmission line including:
  a substrate including a surface;
  a first ground line disposed on the surface;
  a second ground line disposed on the surface;
  a signal line disposed on the surface between the first ground line and the second ground line and forming a coplanar waveguide with the first ground line and the second ground line; wherein the signal line, the first ground line, and the second ground line are substantially parallel in a first section of the radio frequency transmission line; the signal line and the first ground line defining a first gap in the first section; the signal line and the second ground line defining a second gap in the first section; wherein the first gap and the second gap are hermetically sealed by a hermetic seal and include a gas; and
  a plasma limiter disposed between the signal line and the first ground line in the first gap, the plasma limiter integrated into one or more of the signal line or the first ground line, the plasma limiter defining a spark-gap between the signal line and the first ground line; the radio frequency transmission line including a breakdown power threshold at which the gas disposed in the spark-gap is configured to form a plasma; wherein the plasma changes a characteristic impedance of the radio frequency transmission line;
wherein each of the signal line, the first ground line, and the second ground line is coupled to the integrated circuit; wherein the change in the characteristic impedance of the radio frequency transmission line limits a power to the integrated circuit; wherein each of the signal line, the first ground line, and the second ground line is further configured to couple to a carrier substrate;
wherein the plasma limiter comprises a spiral-shaped resonator.

15. The microscale package of claim 14, wherein the integrated circuit is disposed inside of the hermetic seal.

16. The microscale package of claim 14, wherein the integrated circuit is disposed adjacent to the hermetic seal, wherein the hermetic seal includes a dielectric material.

17. The microscale package of claim 14, wherein each of the signal line, the first ground line, and the second ground line is configured to couple to the carrier substrate by a hermetic via.

18. The microscale package of claim 14, wherein the radio frequency transmission line is configured to form the plasma across a frequency range between 2 to 18 gigahertz; wherein the breakdown power is between 1 watt and 10 watts across the frequency range.

19. The microscale package of claim 14, wherein each of the signal line, the first ground line, and the second ground line is coupled to the integrated circuit by a flip chip coupling.

* * * * *